(12) United States Patent  (10) Patent No.: US 8,448,045 B2
Reddy et al.  (45) Date of Patent: May 21, 2013

(54) OUTER CODE ERROR CORRECTION

(75) Inventors: Prafulla Bollampalli Reddy, Longmont, CO (US); Peter Igorevich Vasiliev, Longmont, CO (US); Hui Su, Longmont, CO (US); Timothy Richard Feldman, Louisville, CO (US); Mary Elizabeth Dunn, Denver, CO (US); James Joseph Touchton, Boulder, CO (US); Bernardo Rub, Sudbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 180 days.

(21) Appl. No.: 13/116,882

(22) Filed: May 26, 2011

(65) Prior Publication Data

US 2012/0304037 A1    Nov. 29, 2012

(51) Int. Cl.
*G11C 29/00* (2006.01)
(52) U.S. Cl.
USPC .......................................... 714/764; 714/805
(58) Field of Classification Search ............... 369/59.23, 369/53.2; 714/755, 770, 763, 764, 805, 800
See application file for complete search history.

(56) References Cited

U.S. PATENT DOCUMENTS

| 5,369,641 | A | 11/1994 | Dodt et al. |
| 6,484,269 | B1* | 11/2002 | Kopylovitz .................. 714/5.11 |
| 6,591,339 | B1 | 7/2003 | Horst et al. |
| 6,766,491 | B2* | 7/2004 | Busser .......................... 714/770 |
| 7,263,650 | B2 | 8/2007 | Keeler et al. |
| 7,308,637 | B2 | 12/2007 | Nakagawa et al. |
| 7,339,873 | B2* | 3/2008 | Nakagawa ................. 369/59.23 |
| 7,827,378 | B2 | 11/2010 | Feldman et al. |
| 8,255,763 | B1* | 8/2012 | Yang et al. .................... 714/755 |
| 2006/0126470 | A1* | 6/2006 | Hoshizawa ................. 369/53.2 |

\* cited by examiner

*Primary Examiner* — David Ton
(74) *Attorney, Agent, or Firm* — Cesari & Reed, LLP; Kirk A. Cesari

(57) ABSTRACT

Values are grouped into a first set of groupings of values. Based on inner codes, the number of groupings in the first set of groupings that have at least one erroneous value is determined. If the number of groupings in the first set of groupings that have an erroneous value is fewer than a maximum number of groupings that can be corrected by outer codes, a seek operation is begun. During the seek operation, the outer codes are used to detect and correct the erroneous values that were produced during the reading of values. In other aspects, a parity section for a data section of a data storage device is dirtied before writing any data to the data section such that if writing to the data section is interrupted, the parity section will indicate that it should not be used to correct data read from the data section.

20 Claims, 7 Drawing Sheets

OUTER CODE ERROR CORRECTION

BACKGROUND

Summary

A method and apparatus reads values from a storage medium, wherein the values are grouped into a first set of groupings of values. Based on inner codes, the number of groupings in the first set of groupings that have at least one erroneous value is determined. It is then determined that that the number of groupings in the first set of groupings that have an erroneous value is fewer than a maximum number of groupings that can be corrected by outer codes. A seek operation is begun and during the seek operation, the outer codes are used to detect and correct the erroneous values that were produced during the reading of values.

A method and apparatus dirty a parity section for a data section of a data storage device before writing any data to the data section such that if writing to the data section is interrupted, the parity section will indicate that it should not be used to correct data read from the data section.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Figure 1:
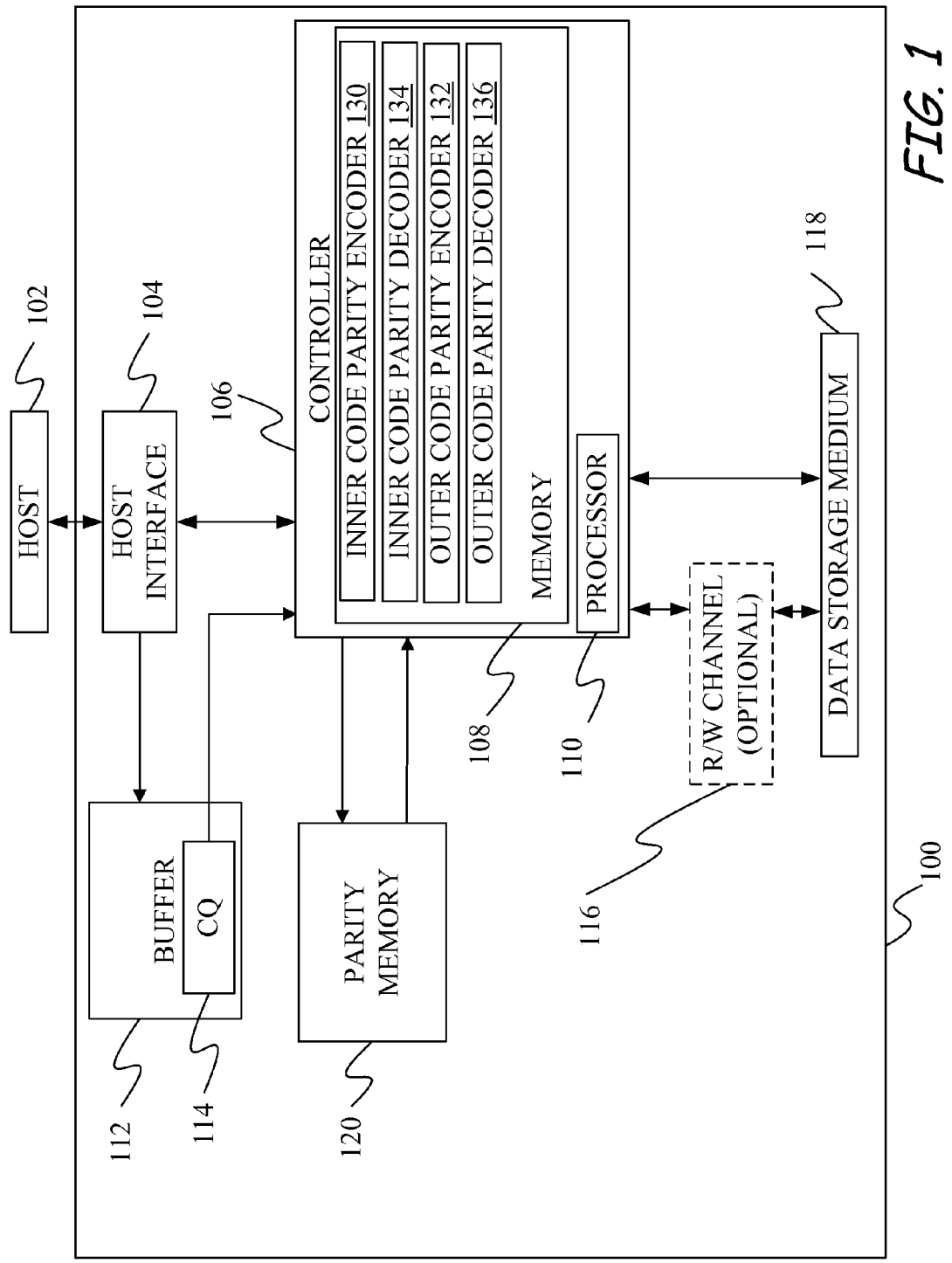
FIG. 1 is a functional block diagram of a data storage device.

FIG. 1 provides a functional block diagram of a data storage device 100 used in embodiments described herein. A hardware/firmware based host interface circuit 104 communicates with an external host 102, such as a processor in an electronics device such as a computer, phone, camera, personal assistant, gaming device, set top box, television, or printer, for example. Although external host 102 is shown as a single host, data storage device 100 may be connected to multiple hosts through host interface 104. Through interface 104, storage device 100 is able to receive data and commands from external host 102 and is able to provide data and error codes to external host 102 based on commands executed by storage device 100.

Data storage device 100 includes a programmable controller 106 with associated memory 108 and processor 110. The programmable controller 106 may be coupled to a buffer 112. The buffer 112 can temporarily store user data during read and write operations, and may include a command queue (CQ) 114 where access operations can be temporarily stored pending execution by controller 106.

Controller 106 executes read and write operations on data storage medium 118. In some embodiments, data storage medium 118 is one or more discs. In alternative embodiments, data storage medium 118 is one or more tapes. In further alternative embodiments, storage medium 118 is a collection of solid-state elements. These read/write operations may be performed directly on data storage medium 118 or through an optional read/write channel 116. The optional read/write (R/W) channel 116 encodes data during write operations and reconstructs user data retrieved from data storage medium 118 during read operations.

Under embodiments described more fully below, controller 106 implements a two-level parity encoding system in which data is encoded using two separate parity product codes that produce two separate sets of parity data. Specifically, memory 108 contains instructions for an inner code parity encoder 130, an outer code parity encoder 132, an inner code parity decoder 134 and an outer code parity decoder 136. To reduce the burden on memory 108, a separate parity memory 120 is provided that stores the user data during the parity encoding. Alternatively, memory 108 can be made large enough to accommodate the user data during parity calculations. If read/write channel 116 is used, the parity encoded data may be passed through read/write channel 116 to further encode the data before storing it on data storage medium 118.

Embodiments described herein use two levels of encoding to detect and correct errors in user data. These embodiments group the user data into two sets of groupings with groupings in the first set of groupings being encoded by an inner code and the groupings of the second set of groupings being encoded by an outer code. The terms inner code and outer code could alternatively be referred to as a first code and a second code and the terms "inner" and "outer" are not meant to represent a particular order in which data is to be encoded or decoded but simply signify that there are two separate codes being applied to two separate groupings of data.

Figure 2:
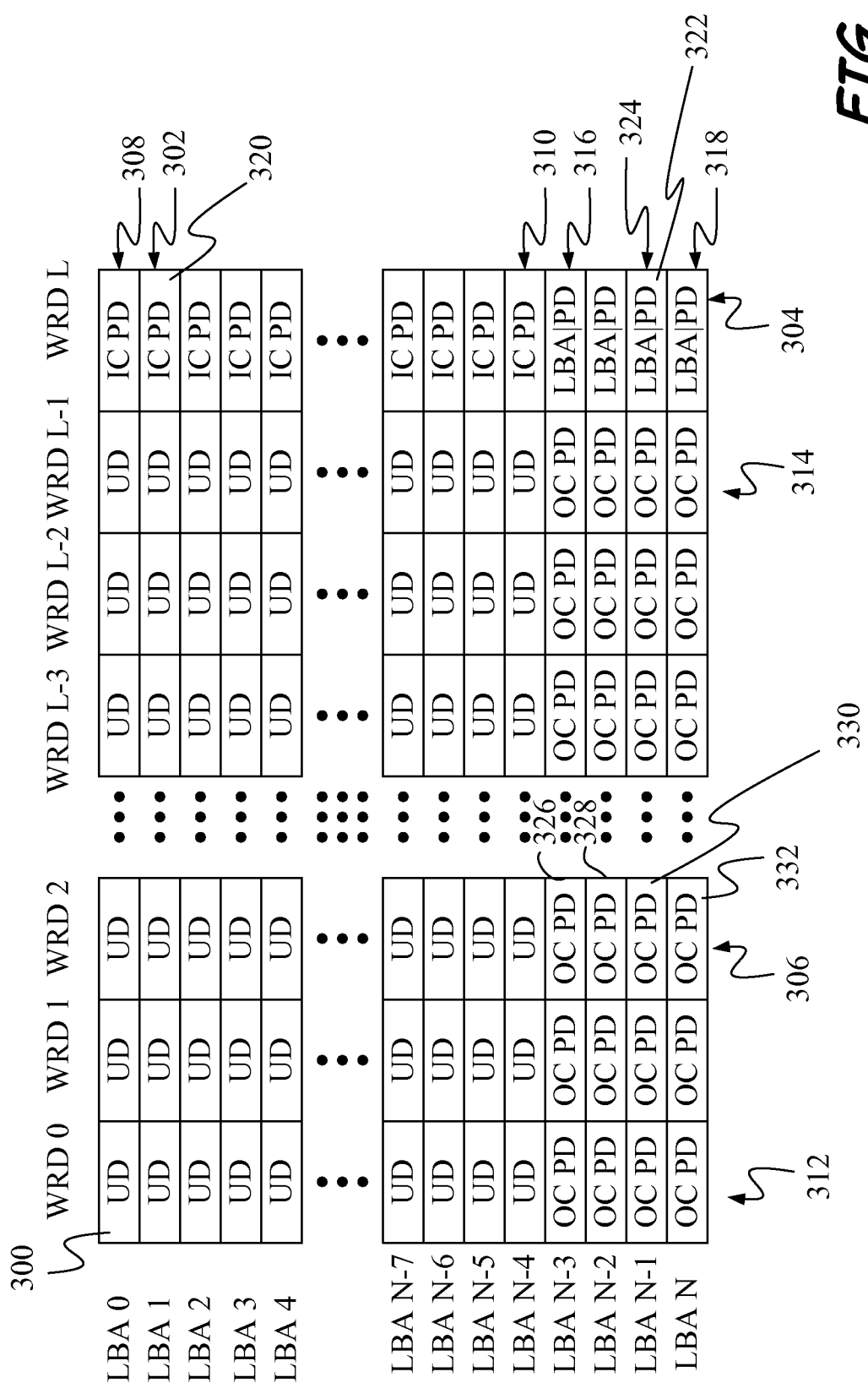
FIG. 2 is a conceptual layout showing the relationship between inner code parity data, user data, and outer code parity data.

FIG. 2 provides a conceptual view of user data and its grouping into two sets of groupings for encoding using an inner code and an outer code. In FIG. 2, each block such as block 300 represents a multi-bit word, for example an 8-bit word. Each row of blocks in FIG. 2 represents one grouping of a first set of groupings and each symbol position in each column of blocks in FIG. 2 represents one grouping of a second set of groupings. In FIG. 2, each row is labeled with a logical block address (LBA), which are numbered 0-N. For example, row 302 is labeled as LBA 2. Each column in FIG. 2 is labeled with a word label, numbered 0 to L. Column 306, for instance, is labeled as Word 2.

In FIG. 2, the data words located in rows 308 to 310 that are also located in columns 312 to 314 contain user data (UD). These rows and columns constitute a data section. Data words in column 304 between rows 308 and 310 contain parity data for an inner code parity encoding scheme and are considered an inner code parity section. Data words in columns 312 to 314 and rows 316 to 318 contain outer code parity data and are considered an outer code parity section. The data words in column 304 between rows 316 and 318 contain a logical block address codeword concatenated with inner code parity data (LBA|PD) and may also be considered part of the outer code parity section.

Each inner code parity data value in column 304 is determined based on the data words in columns 312 to 314 for the corresponding row. For example, inner code parity data block 320 of column 304 provides parity data calculated from the user data in row 302 between columns 312 and 314, inclusive. Similarly, data word 322 in column 304 provides a linear block address codeword concatenated with parity data calculated from the linear block address codeword and the outer code parity data found in row 324 between columns 312 and 314.

The outer code parity data found in rows 316 to 318 such as outer code parity data words 326, 328, 330, and 332 provide parity data for the user data in the corresponding column between rows 308 and 310. For example, outer code parity data words 326, 328, 330, and 332 provide parity data for user data in column 306 between rows 308 and 310. Under one embodiment, each symbol of each data word has a corresponding symbol in each parity data word. For example, the most significant symbol in the user data words of column 306 has a corresponding most significant symbol of parity data in parity data words 326, 328, 330, and 332.

Any number of rows can be provided for the outer code parity data. The more rows that are provided for the outer code parity data the more errors that can be detected and corrected by the outer code parity data. However, increasing the number of rows and thereby increasing the number of parity data symbols, comes at a cost of reduced storage efficiency.

Under one embodiment, each group in the first set of groupings, indicated by a row in FIG. 2, is associated with a logical block address. The logical block address designates an address for a block of data and inner code parity data on a storage medium. In embodiments in which a disk drive provides the storage medium, the logical block address can be the logical block address of a sector on the storage medium. In such disk drive embodiments, the logical block addresses of the outer code parity data, designated as LBA N-3 to LBA N, rows 316 to 318 in FIG. 2, are grouped together in a single location on a track. Further, under some embodiments, each track only contains a single grouping of logical block addresses for the outer code parity data. Under one particular embodiment, the logical block addresses for the outer code parity data found in rows 316 to 318 of FIG. 2 are designated as occurring at the beginning of a track.

Figure 3:
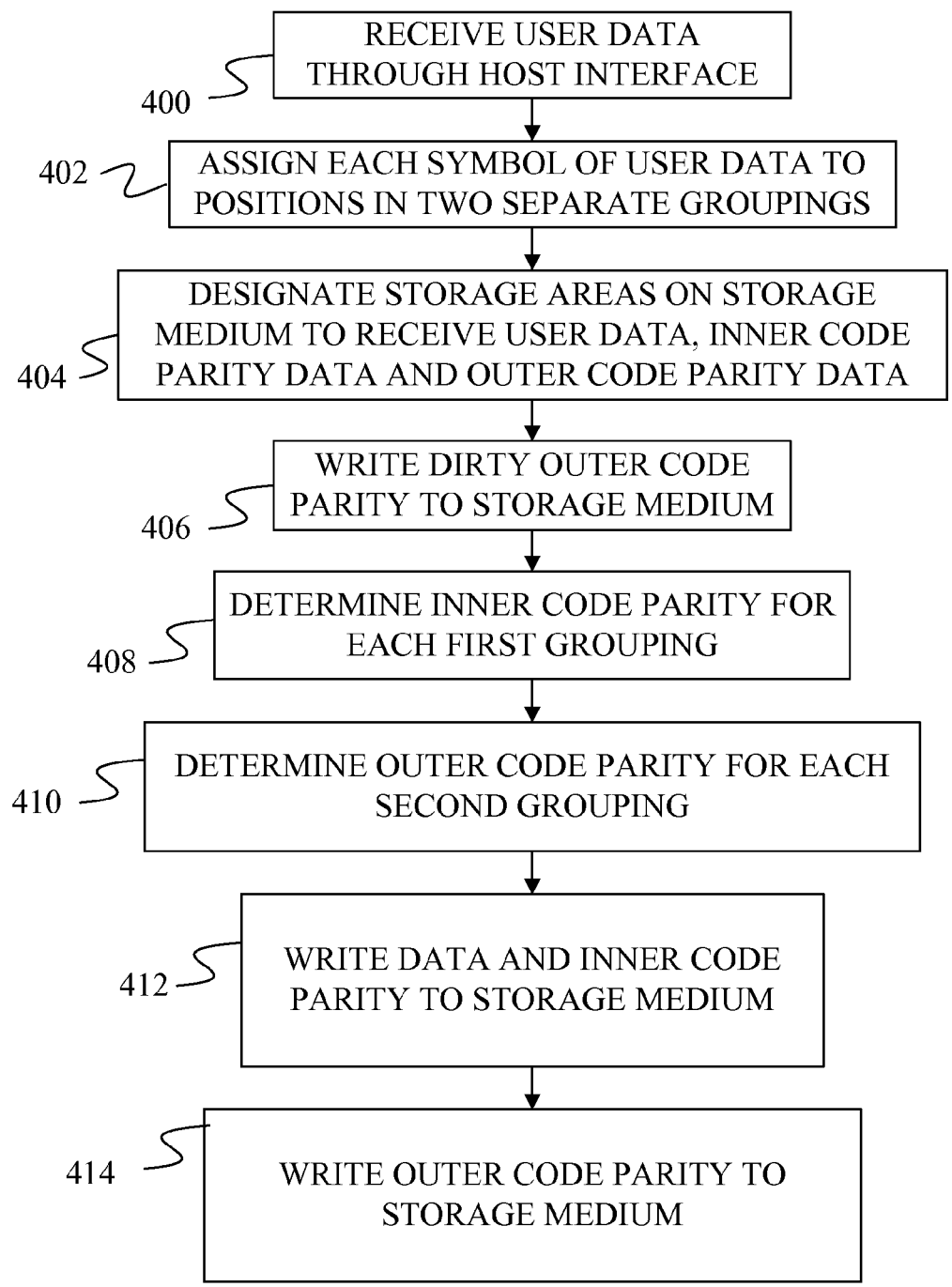
FIG. 3 is a flow diagram for writing data under one embodiment.

FIG. 3 provides a flow diagram of a method for writing data to a storage medium under some embodiments. In step 400, storage device 100 receives user data through host interface 104 from host 102. At step 402, controller 106 assigns each symbol of the received data to positions in two separate groups of symbols. For example, in FIG. 2, each symbol of user data is assigned to a position associated with a logical block address (first group) and a position within a word (second group). Under one embodiment, a symbol that is assigned to a first group and a second group will be the only symbol from the first group that is in the second group and will be the only symbol from the second group that is in the first group. Under one embodiment, the user data is stored in memory 120 so that the user data may be retrieved based on its positions within the first and second group.

Although the user data and parity data has been described as being assigned to blocks of data associated with a logical block address, the blocks of data do not have to be associated with a logical block address and may be associated with any grouping. The logical block addresses represent one example of a first set of groupings but other types of groupings may be used.

At step 404, storage areas, also referred to as storage locations, on the storage medium are designated to receive the user data, inner code parity data, and outer code parity data. At step 406, controller 106 writes dirty outer code parity data to the designated outer code parity data storage locations on data storage medium 118. For example, in FIG. 2, dirty outer code parity data would be written to words 0-L of logical block addresses LBA N-3, LBA N-2, LBA N-1, and LBA N. The dirty outer code parity data indicates that user data in user data storage locations associated with the parity data storage locations have not been encoded with outer code parity data and as such, the dirty outer code parity data should not be used to correct the user data in the user data storage locations. The dirty outer code parity data is written to the storage medium before writing any of the user data assigned to the user data storage locations to the storage medium.

At step 408, controller 106 determines inner code parity data for each first grouping of symbols stored in parity memory 120 using inner code parity encoder 130. For example, in FIG. 2, inner code parity data would be determined for each logical block address 0-N-4. Under one embodiment, the inner code parity is a Low Density Parity Check Code (LDPC) with the information part of the inner LDPC being a codeword of an Error Detecting Code to ensure that LDPC does not mis-correct the data. The parity bits determined using the inner code are stored in parity memory 120.

At step 410, controller 106 determines the outer code parity for each second grouping of symbols stored in parity memory 120 using outer code parity encoder 132. For example, in FIG. 2, outer code parity is determined for each symbol position in each word from word 0 to word L-1. Under one embodiment, the outer code parity is determined using a Reed-Solomon code, which is an example of a product code.

Figure 4:
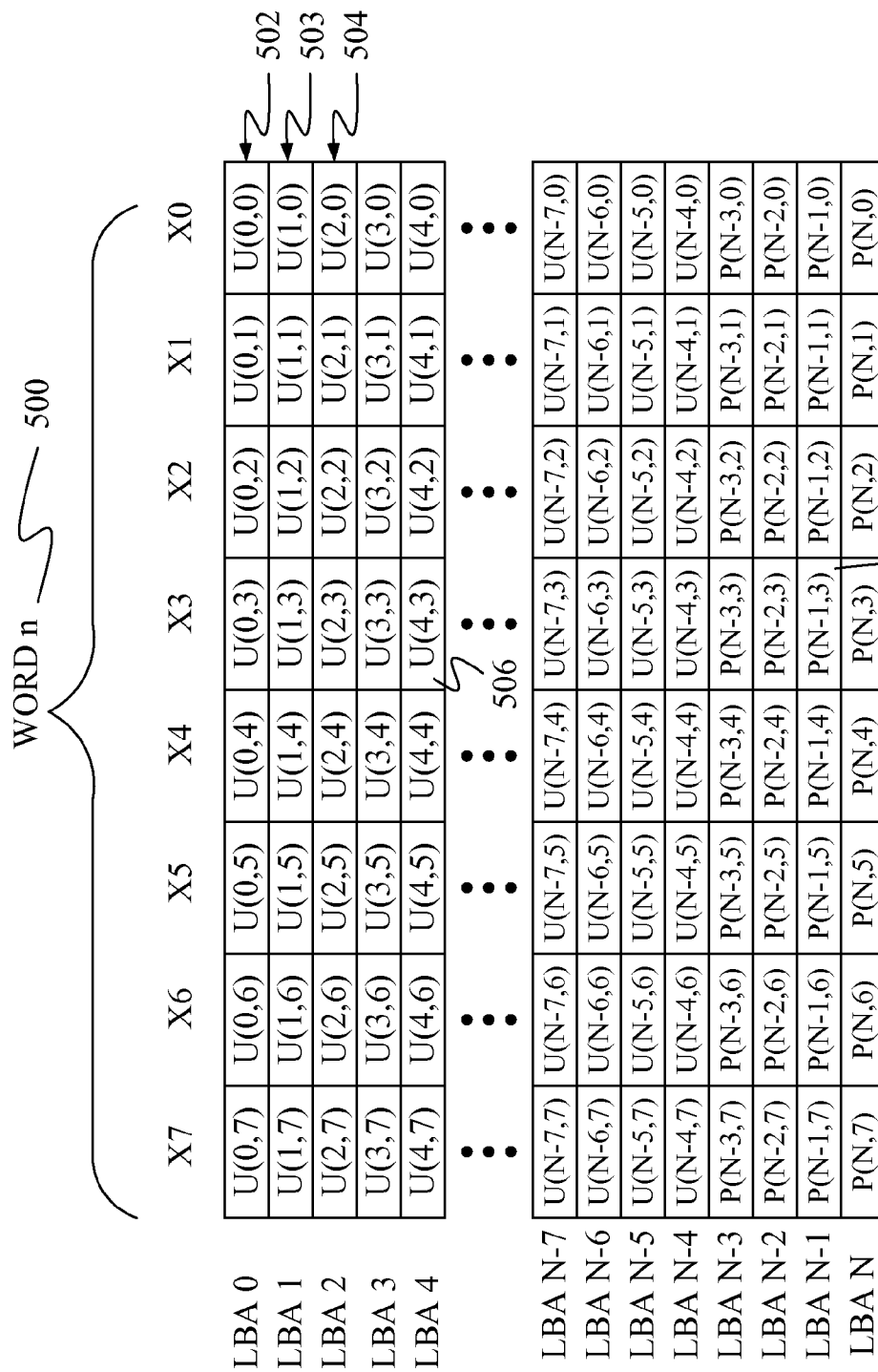
FIG. 4 is a conceptual layout showing individual symbols in one word of the conceptual layout of FIG. 2.

FIG. 4 shows a diagram showing the relationship between the parity symbols and the user data symbols for a word n 500 of the logical block addresses of FIG. 2. As shown in FIG. 4, each logical block address has a word at word position 500 such as words 502 for logical block address 0, word 503 for logical block address 1, and word 504 for logical block address 2. Each word is divided into individual symbol positions labeled as symbol positions X0, X1, X2, X3, X4, X5, X6, and X7. In FIG. 4, each symbol of the user data is identified as U(LBA number, symbol number). For example, symbol 506 which is symbol X3 of the word in LBA 4 is labeled as U(4,3) in FIG. 4. Parity symbols in FIG. 4 are labeled as P(LBA number, symbol number). For example, the parity symbol 508 which is symbol X3 of LBA N-1 is labeled as P(N-1,3).

The parity symbols are generated for each symbol position separately. Thus, for word position 500, the parity symbols for symbol position X0 are determined separately from the parity symbols for symbol position X1. To determine the parity symbols for a symbol position, the user symbols at that symbol position for each logical block address are concatenated together to form a value. For example, for symbol position X6 symbol values U(0,6), U(1,6), U(2,6), U(3,6), U(4,6), . . . U(N-7,6), U(N-6,6), U(N-5,6), and U(N-4,6) would be concatenated together to form a value. This value is then applied to an outer code parity encoder 132, which under one embodiment is a Reed Solomon encoder. The encoder returns a number of parity bits equal to the number of logical block addresses that have been set aside to receive outer code parity. For example, in FIG. 4, four logical block addresses are provided for the outer code parity and as such the outer code parity encoder 132 produces four symbols of parity for each symbol position of the word. The output parity symbols are then assigned to the logical block addresses. For example, for symbol position X6 in FIG. 4, the four parity symbols generated by the parity encoder would be assigned to symbols P(N-3,6), P(N-2,6), P(N-1,6), and P(N,6), respectively. After each symbol position has been processed, a parity word has been generated for each logical block address assigned to receive parity data.

When the outer code parity data has been determined for each second grouping of symbols, the user data and the inner code parity data is written to the storage medium at step 412. Under some embodiments, step 412 may be performed before step 410 or during step 410. At step 414, the outer code parity data is written to the storage medium. This writing of the outer code parity overrides the dirty outer code parity that was written at step 406.

Figure 5:
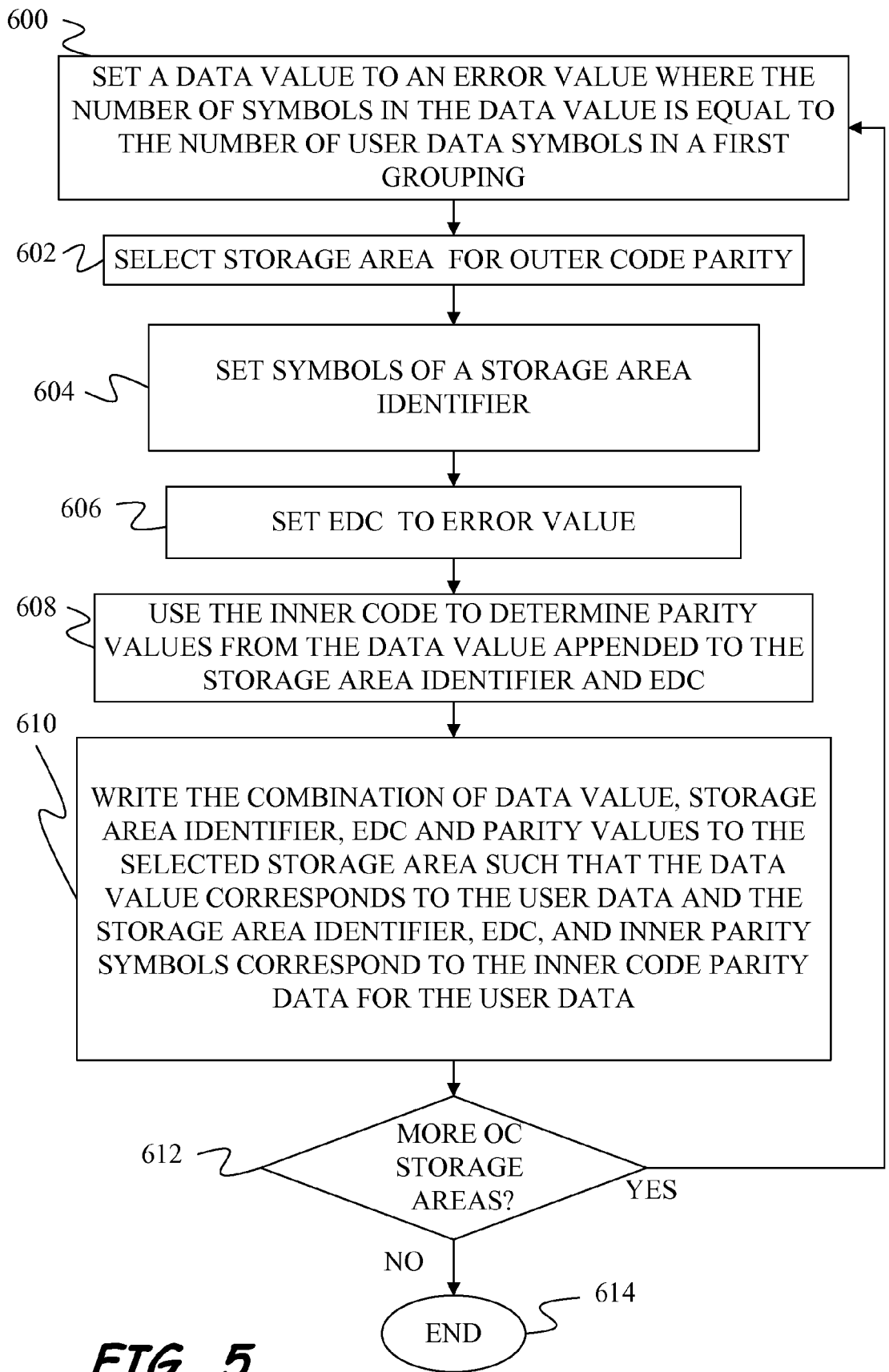
FIG. 5 is a flow diagram for dirtying parity data before writing user data.

FIG. 5 provides a flow diagram of a method of writing dirty outer code parity to a storage medium, which is shown as step 406 in FIG. 3.

In step 600 of FIG. 5, a data value having as many symbols as the number of symbols in the user data of any one of the first groupings of symbols is set to a value that indicates that the user data has not been encoded using the outer code parity encoder. In the example of FIG. 2, the data value would have has many symbols as the symbols in the user data from columns 312 to 314 of a single logical block address. Under one embodiment, the data value is set to all 1s.

At step 602, a storage area that has been designated to contain the outer code parity bits is selected. In the example of FIG. 2, this involves selecting a logical block address, such as logical block address LBA N-3.

At step 604, symbols of a storage area identifier are set to a value that identifies the selected storage area. In the example of FIG. 2, the storage area identifier would be set to the logical block address of the logical block address selected in step 602.

At step 606, an error detection code (EDC) is set to an error value. Under one embodiment, this error value is all 1s.

Under some embodiments, the logical block address value contains more symbols than are necessary to identify the logical block address. In such embodiments, the excess symbol positions in the logical block address value are used to hold the error detection code. In such embodiments, the combination of the logical block address without excess symbols and the error detection code is referred to herein as a logical block address codeword. Under most embodiments, the logical block address occupies either the most significant symbol positions or the least significant symbol positions of the logical block address code word and the error detection code occupies the remaining symbol positions.

At step 608 the inner parity code is used to determine parity values from a concatenation of the data value, the error detection code and the logical block address. In embodiments where the EDC replaces excess symbols in the logical block address, the concatenation is formed by concatenating the data value and the logical block address codeword. Under one embodiment, the inner parity code used in step 608 is a Reed Solomon code.

At step 610, the parity values are appended to the combination of the data value, the error detection code and the logical block address and the resulting value is written to the selected storage area. Under some embodiments, the resulting value is written such that the data value corresponds to the user data that is to be encoded with the outer parity code and the error detection code, the logical block address and the parity value correspond to the inner code parity values encoded for the user data. In the example of FIG. 2, the data value would be stored in words 0 to L-1 found in columns 312 to 314 and the error detection code, logical block address and parity values would be stored in word L of column 304. In FIG. 2, the words in column 304 are denoted as containing LBA|PD, which signifies a logical block address codeword concatenated with parity data, where the logical block address codeword contains both the error detection code and the logical block address.

Although the storage area identifier has been shown as being stored in the outer code parity data above, in other embodiments, the storage area identifier is not present. In such embodiments, the parity data is formed based on the combination of the data value and error detector code and the error detector code and parity data are stored such that they correspond to the inner code parity values encoded for the user data.

At step 612, controller 106 determines if there are more outer code storage areas that have been designated to receive outer code parity data. If there are more outer code storage areas, the process returns to step 602 to select the next storage area for the outer code parity. Steps 604, 606. 608, and 610 are then repeated for the new storage area for the outer code parity. When at step 612 there are no further outer code storage areas, the process ends at step 614.

Figure 6:
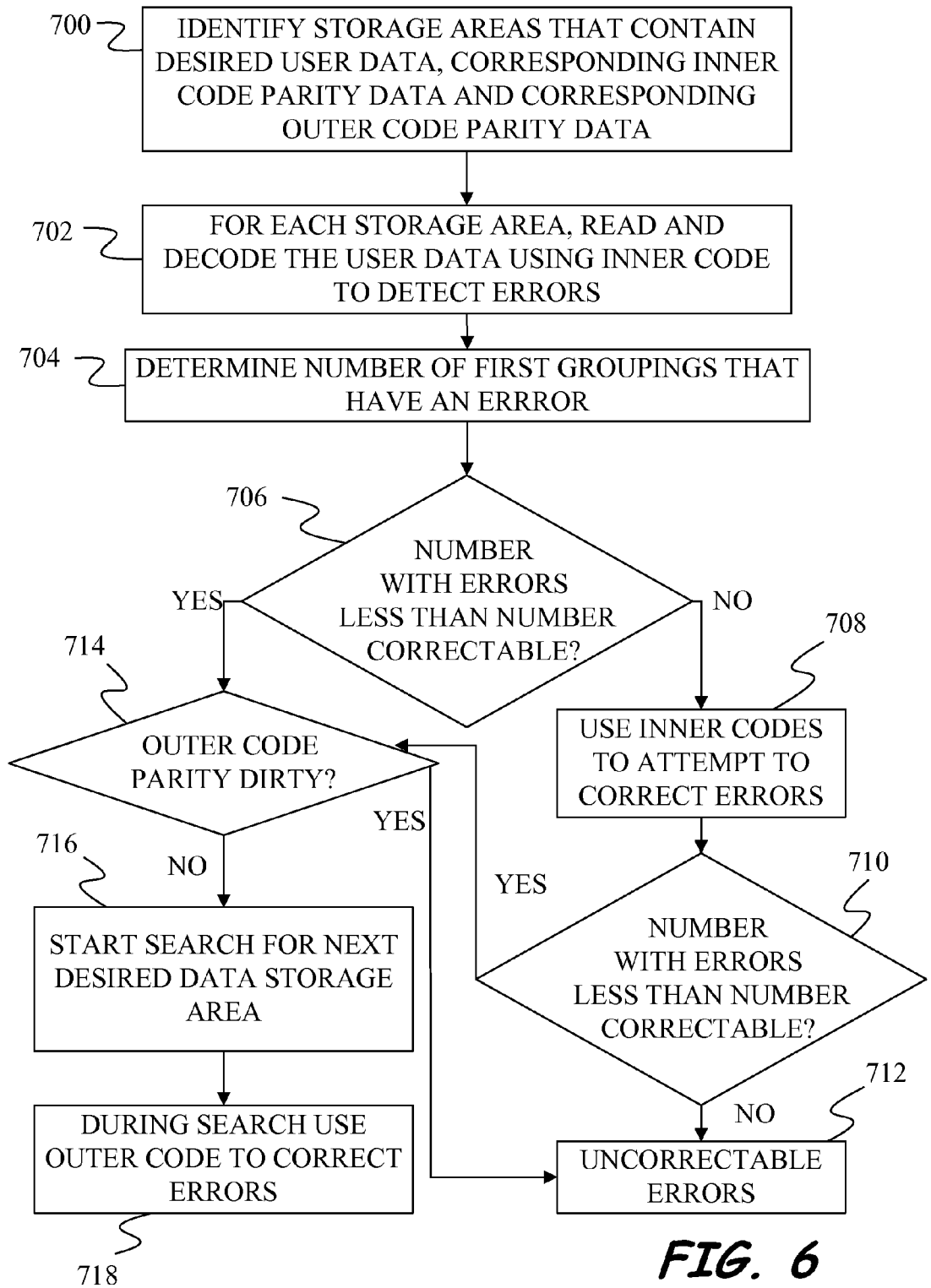
FIG. 6 is a flow diagram for reading user data and correcting errors in the user data.

FIG. 6 provides a flow diagram for reading data values from a storage medium and detecting and correcting errors in the read values. In step 700, the storage areas (storage locations) that contain desired user data as well as storage areas (storage locations) containing corresponding inner code parity data and outer code parity data are identified. This involves identifying all of the storage areas that contain user data or parity data that was encoded with the desired user data using either an inner parity code or an outer parity code. For example, in FIG. 2, all of the storage areas are identified in step 700 even if only a small subset of the user data is desired.

In step 702, for each identified storage area the values in those storage areas are read and decoded using the inner code parity decoder 134 to detect but not correct errors. Thus, each first grouping of user data and outer code parity data is decoded using the inner code to detect but not correct errors. In the example of FIG. 2, the symbols of each logical block address LBA 0 to LBA N for the user data and outer code parity data is decoded using the corresponding inner code and inner code parity data.

At step 704, the number of first groupings that have at least one error is determined. In the example of FIG. 2, step 704 involves determining the number of logical block addresses that have at least one error.

At step 706, the number of first groupings with at least one error is compared to the number of errors that the outer code parity can correct. If the number of first groupings with errors is not less than the number of errors that is correctable by the outer code parity, the inner code parity decoder 134 is used to attempt to correct the errors at step 708.

After the attempt to correct errors using the inner code parity, the number of first groupings that still have at least one error is again compared to the number of errors that are correctable using the outer code parity. If the number of first groupings is still greater than the number that is correctable by the outer code parity, the errors are uncorrectable as indicated by step 712.

Figure 7:
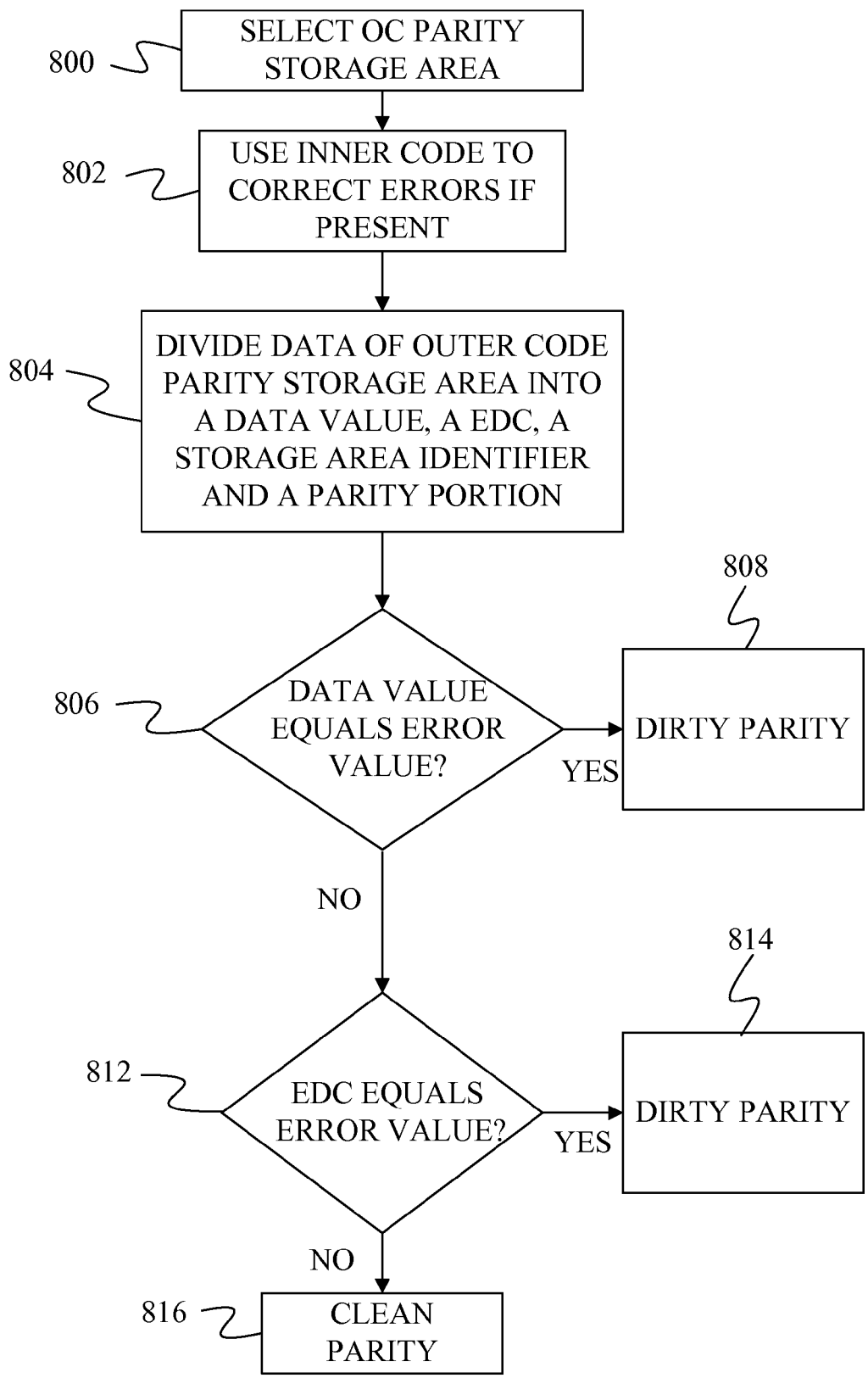
FIG. 7 is a flow diagram for determining whether outer code parity data is dirty.

If the number of first groupings (in FIG. 2, logical block addresses) with errors is less than the number of errors that are correctable by the outer code parity at step 706 or step 710, controller 106 examines the outer code parity data to determine if it is dirty at step 714. A technique for determining if the outer code parity data is dirty is shown in FIG. 7, discussed further below.

If the outer code parity data is dirty at step 714, it cannot be used to correct the errors in the read data and the process ends at step 712 with uncorrectable errors.

If the outer code parity data is not dirty at step 714, a search for the storage area of next desired data is started at step 716. For embodiments involving disk drives, this search involves beginning a seek operation to move the head to a new track and/or new sector.

During the search operation, controller 106 executes outer code parity decoder 136, which uses outer code parity data to detect and correct errors in the outer code parity data and the user data at step 718. This involves applying a respective outer code to each grouping in the second set of groupings that has at least one value that is in a grouping in the first set of groupings that has an erroneous value even though fewer than all of the values of the grouping of the first set of groupings are erroneous. Since the errors are detected and corrected while searching for the storage areas of the next desired data, the embodiments that perform this step are more efficient in processing data than in previous error correction code schemes.

FIG. 7 provides a flow diagram of a method of determining whether outer code parity data is dirty as represented by step 714 of FIG. 6. At step 800, an outer code parity storage area is selected. In the example of FIG. 2, this involves selecting a logical block address such as logical block address LBA N-3. At step 802, the inner parity code is used to correct any errors detected in the outer code parity data of the selected storage area at step 702 of FIG. 6.

At step 804, the data of the outer code parity storage area is divided into a data portion, an error detection code, a storage area identifier, and an inner parity portion. In embodiments where the error detection code is found in the excess symbol positions of a logical block address, the data of the outer code parity storage area is first divided into a data portion, a logical block address codeword and a parity portion and then the logical block address codeword is further divided into the error detection code and the logical block address.

The data portion consists of symbols that correspond to symbols of user data while the error detection code, storage area identifier and inner parity portion correspond to inner parity data for the user data. The storage area identifier identifies the storage area where the outer code parity data is stored on the storage medium.

At step 806, the data portion is examined to determine if it is equal to an error value, which under one embodiment is equal to all 1s and in other embodiments is all 0s. If the data portion is equal to the error value, the outer code parity data is considered dirty parity at step 808. If the data portion is not equal to the error value at step 806, the error detection code is compared to an error value at step 812. Under one embodiment, the error value is equal to all 1s. If the error detection code equals the error value, the outer code parity data is considered to be dirty at step 814. If the error detection code does not equal the error value at step 812, the outer code parity data is considered to be clean at step 816.

In some embodiments, each of the outer code parity data storage areas is examined to determine if any of them contain dirty parity data. In such embodiments, instead of finding that the parity data is clean in step 816, a next outer code parity storage area is selected by returning to step 800. When there are no further outer code parity storage areas be considered and none of them have been identified as containing dirty parity, the outer code parity data is considered to be clean.

The illustrations of the embodiments described herein are intended to provide a general understanding of the structure of the various embodiments. The illustrations are not intended to serve as a complete description of all of the elements and features of apparatuses and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above sections and/or arrangement of paragraphs are provided for ease of reading only and, for example, do not limit one or more aspects of the disclosure discussed in a particular section with respect to a particular example and/or embodiment from being combined with, applied to, and/or utilized in another particular example, and/or embodiment which is described in another section. Elements, features and other aspects of one or more examples may be combined and/or interchangeable with elements, features and other aspects of one or more other examples described herein.

What is claimed is:

1. A method comprising:
   reading values from a storage medium, the values grouped into a first set of groupings of values;
   determining, based on inner codes, a number of groupings in the first set of groupings that have at least one erroneous value;
   determining that the number of groupings that have an erroneous value is fewer than a maximum number of groupings that can be corrected by outer codes; and
   during a seek operation, using the outer codes to detect and correct the erroneous values.

2. The method of claim 1 wherein at least some of the values in each grouping of the first set of groupings are also in a grouping of a second set of groupings, and wherein the outer codes detect and correct the erroneous values by detecting and correcting the erroneous values in each grouping of the second set of groupings separately.

3. The method of claim 1 wherein determining the number of groupings that have an erroneous value comprises determining that there is an erroneous value without attempting to correct the erroneous value.

4. The method of claim 1 wherein using the outer codes to detect and correct the erroneous values comprises applying a respective outer code to each grouping in the second set of groupings that has at least one value that is in a grouping in the first set of groupings that has an erroneous value even though fewer than all of the values of the grouping of the first set of groupings are erroneous.

5. The method of claim 1 further comprising before beginning the seek operation, determining if parity data used in an outer code indicate that the second set of groupings have yet to be encoded with the outer codes.

6. The method of claim 5 wherein determining if parity data used in an outer code indicate that the second set of groupings have yet to be encoded with the outer codes comprises decoding the parity data using the inner code and comparing at least part of the decoded data to at least one value that indicates that the second set of groupings have yet to be encoded with the outer code.

7. The method of claim 6 wherein comparing at least part of the decoded data to at least one value comprises dividing the decoded data into at least a data portion and a logical block address portion and comparing the data portion to a value that indicates that the second set of groupings have yet to be encoded with the outer code.

8. The method of claim 6 wherein comparing at least part of the decoded data to at least one value comprises dividing the decoded data into at least a data portion and a logical block address portion and comparing at least a portion of the logical block address portion to a value that indicates that the second set of groupings have yet to be encoded with the outer code.

9. The method of claim 8 wherein the logical block address portion comprises an error detection code and a logical block address for a storage area containing the parity data and wherein comparing at least a portion of the logical block address portion to the value comprises comparing the error detection code to the value.

10. The method of claim 6 wherein comparing at least part of the decoded data to at least one value comprises dividing the decoded data into a data portion and a logical block address portion and comparing the data portion to a value that indicates that the second set of groupings have yet to be encoded with the outer code and comparing at least a portion of the logical block address portion to a value that indicates that the second set of groupings have yet to be encoded with the outer code.

11. An apparatus comprising:
user data storage locations designated to receive user data;
parity data storage locations designated to receive parity data used to encode the user data;
a controller that writes user data to the user data storage locations, that computes parity data based on the user data and that stores the parity data in the parity data storage locations, wherein before writing user data to the user data storage locations, the controller writes values to the parity data storage locations to indicate that the user data in the user data storage locations have not been encoded using the parity data in the parity data storage locations.

12. The apparatus of claim 11 wherein writing values to the parity data storage locations comprises applying at least one value to a parity encoder to form a parity encoded value and writing the parity encoded value to the parity data storage location, wherein when decoded, the at least one value indicates that the user data in the user data storage locations have not been encoded using the parity data in the parity data storage locations.

13. The apparatus of claim 12 wherein writing values to the parity data storage locations comprises applying at least two values to a parity encoder to form a parity encoded value and writing the parity encoded value to the parity data storage location, wherein when decoded, the at least two values each independently indicate that the user data in the user data storage locations have not been encoded using the parity data in the parity data storage locations.

14. The apparatus of claim 13 wherein one of the at least two values comprises a logical block address codeword comprising a logical block address for the parity data storage locations and an error detection code.

15. The apparatus of claim 14 wherein the error detection code indicates that the user data in the user data storage location have not been encoded using the parity data of the parity data storage locations.

16. The apparatus of claim 11 wherein the controller receives values representing data read from the user data storage locations, determines that at least some of the values are erroneous, receives parity values representing data read from the parity data storage locations, determines from the parity values that the user data in the user data storage locations have not been encoded using the parity data in the parity data storage locations and decides not to correct the erroneous values using the parity values.

17. A method comprising:
before writing any data to a data section of a data storage device, dirtying a parity section for the data section of the data storage device such that the parity section will indicate that it should not be used to correct data read from the data section.

18. The method of claim 17 wherein dirtying the parity section comprises writing at least one value to the parity section that indicates that the parity section should not be used to correct data read from the data section.

19. The method of claim 18 wherein writing at least one value to the parity section comprises writing a value having all 1s or all 0s to a data portion of the parity section.

20. The method of claim 17 wherein writing at least one value comprises writing at least two values that each separately indicate that the parity section should not be used to correct data read from the data section.

* * * * *